United States Patent
Meruva et al.

(10) Patent No.: US 12,095,467 B2
(45) Date of Patent: Sep. 17, 2024

(54) COMPACT DIGITAL DELAY LOCKED LOOP

(71) Applicant: QUALCOMM Incorporated, San Diego, CA (US)

(72) Inventors: Anand Meruva, San Diego, CA (US); Jeffrey Mark Hinrichs, San Diego, CA (US); Prince Mathew, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/974,460

(22) Filed: Oct. 26, 2022

(65) Prior Publication Data

US 2024/0146313 A1    May 2, 2024

(51) Int. Cl.
| | |
|---|---|
| *H03L 7/081* | (2006.01) |
| *H03K 5/131* | (2014.01) |
| *H03K 5/134* | (2014.01) |
| *H03K 5/00* | (2006.01) |

(52) U.S. Cl.
CPC .......... *H03L 7/0814* (2013.01); *H03K 5/131* (2013.01); *H03K 5/134* (2014.07); *H03L 7/0818* (2013.01); *H03K 2005/00058* (2013.01)

(58) Field of Classification Search
None
See application file for complete search history.

(56) References Cited

U.S. PATENT DOCUMENTS

| | | | | |
|---|---|---|---|---|
| 5,300,837 | A * | 4/1994 | Fischer | H03K 19/00323 327/394 |
| 7,382,117 | B2 * | 6/2008 | Suda | H03K 5/133 324/750.01 |
| 7,388,415 | B2 | 6/2008 | Lee | |
| 7,884,558 | B2 * | 2/2011 | Steele | H05B 45/20 315/307 |
| 9,584,105 | B1 | 2/2017 | Foley | |
| 9,590,638 | B2 * | 3/2017 | Calhoun | G06F 1/3287 |
| 10,158,352 | B2 | 12/2018 | Hsu et al. | |
| 10,965,293 | B1 | 3/2021 | Chang et al. | |
| 11,329,654 | B2 | 5/2022 | Choi et al. | |
| 11,398,816 | B2 | 7/2022 | Satoh | |
| 2007/0132492 | A1 | 6/2007 | Chou | |
| 2009/0189658 | A1 | 7/2009 | Tomar et al. | |

(Continued)

FOREIGN PATENT DOCUMENTS

| | | |
|---|---|---|
| EP | 1178610 A2 | 2/2002 |
| WO | 2022186998 A1 | 9/2022 |

OTHER PUBLICATIONS

Partial International Search Report—PCT/US2023/073047—ISA/EPO—Jan. 2, 2024.

(Continued)

*Primary Examiner* — Cassandra F Cox
(74) *Attorney, Agent, or Firm* — Loza & Loza, LLP

(57) ABSTRACT

A delay buffer includes a delay device having an input, an output, and a current terminal. The delay buffer also includes a current circuit coupled between a rail and the current terminal. The current circuit includes transistors and switches. Each one of the switches is coupled in series with a respective one of the transistors between the rail and the current terminal.

19 Claims, 9 Drawing Sheets

(56) References Cited

U.S. PATENT DOCUMENTS

2016/0359491 A1   12/2016   Suetinov et al.

OTHER PUBLICATIONS

Seo S.Y., et al., "A Digitally Controlled Oscillator With Wide Frequency Range and Low Supply Sensitivity", IEEE Transactions on Circuits and Systems II: Express Briefs, IEEE, USA, vol. 58, No. 10, Oct. 1, 2011, XP011363367, pp. 632-636, Section I, Figure 1, Section III, Figures 4,5,7, Figure 5.
International Search Report and Written Opinion—PCT/US2023/073047—ISA/EPO—Apr. 23, 2024.

* cited by examiner

COMPACT DIGITAL DELAY LOCKED LOOP

BACKGROUND

Field

Aspects of the present disclosure relate generally to delay, and, more particularly, to delay locked loops.

Background

A delay circuit may be used to delay a signal by an adjustable (i.e., tunable) delay. The adjustable delay may be used to adjust the timing of a first signal relative to a second signal (e.g., to align the first signal with the second signal or produce a desired phase between the first signal and the second signal). The delay of the delay circuit may be controlled by a control signal that is generated using a delay locked loop (DLL).

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a delay buffer. The delay buffer includes a delay device having an input, an output, and a first current terminal. The delay buffer also includes a first current circuit coupled between a first rail and the first current terminal. The first current circuit includes first transistors, and first switches, wherein each one of the first switches is coupled in series with a respective one of the first transistors between the first rail and the first current terminal.

A second aspect relates to a delay locked loop (DLL). The DLL includes a delay circuit having an input and an output, wherein the input of the delay circuit is coupled to an input of the DLL. The DLL also includes a phase detector having a first input, a second input, and an output, wherein the first input of the phase detector is coupled to the output of the delay circuit, and the second input of the phase detector is coupled to the input of the DLL. The DLL also includes a delay control circuit having an input, a first output, and a second output, wherein the input of the delay control circuit is coupled to the output of the phase detector, and the first output of the delay control circuit is coupled to the delay circuit. The DLL further includes a voltage circuit having an input and an output, wherein the input of the voltage circuit is coupled to the second output of the delay control circuit, and the output of the voltage circuit is coupled to the delay circuit.

A third aspect relates to a method for locking a delay locked loop (DLL. The DLL includes a phase detector, and a delay circuit coupled to an input of the phase detector, wherein a delay of the delay circuit includes a coarse delay controlled by a coarse delay control signal and a fine delay controlled by a fine delay control signal. The method includes sweeping the coarse delay control signal until an output of the phase detector toggles from a first logic value to a second logic value. The method also includes, after the output of the phase detector toggles from the first logic value to the second logic value, decreasing the coarse delay control signal by a coarse delay, wherein the decrease in the coarse delay control signal causes the output of the phase detector to toggle from the second logic value to the first logic value. The method further includes, after the output of the phase detector toggles from the second logic value to the first logic value, sweeping the fine delay control signal until the output of the phase detector toggles from the first logic value to the second logic value.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

A delay circuit may be used to delay a signal by an adjustable (i.e., tunable) delay. The adjustable delay may be used to adjust the timing of a first signal relative to a second signal (e.g., to align the first signal with the second signal or produce a desired phase between the first signal and the second signal). For example, a delay circuit may be used in a data interface that includes a latch configured to latch data bits from a data signal on edges of a clock signal. In this example, the delay circuit may be used to adjust the timing of the clock signal or the data signal to center the edges of the clock signal between transitions of the data signal. In another example, one or more delay circuits may be used at a data interface that receives multiple data signals in parallel. In this example, the received data signals may be misaligned in time and the one or more delay circuits may be used to adjust the timing of the data signals to realign the data signals. It is to be appreciated that the present disclosure is not limited to the above examples, and that delay circuits may be used in a wide variety of applications to adjust the timing of one or more signals.

Figure 1:
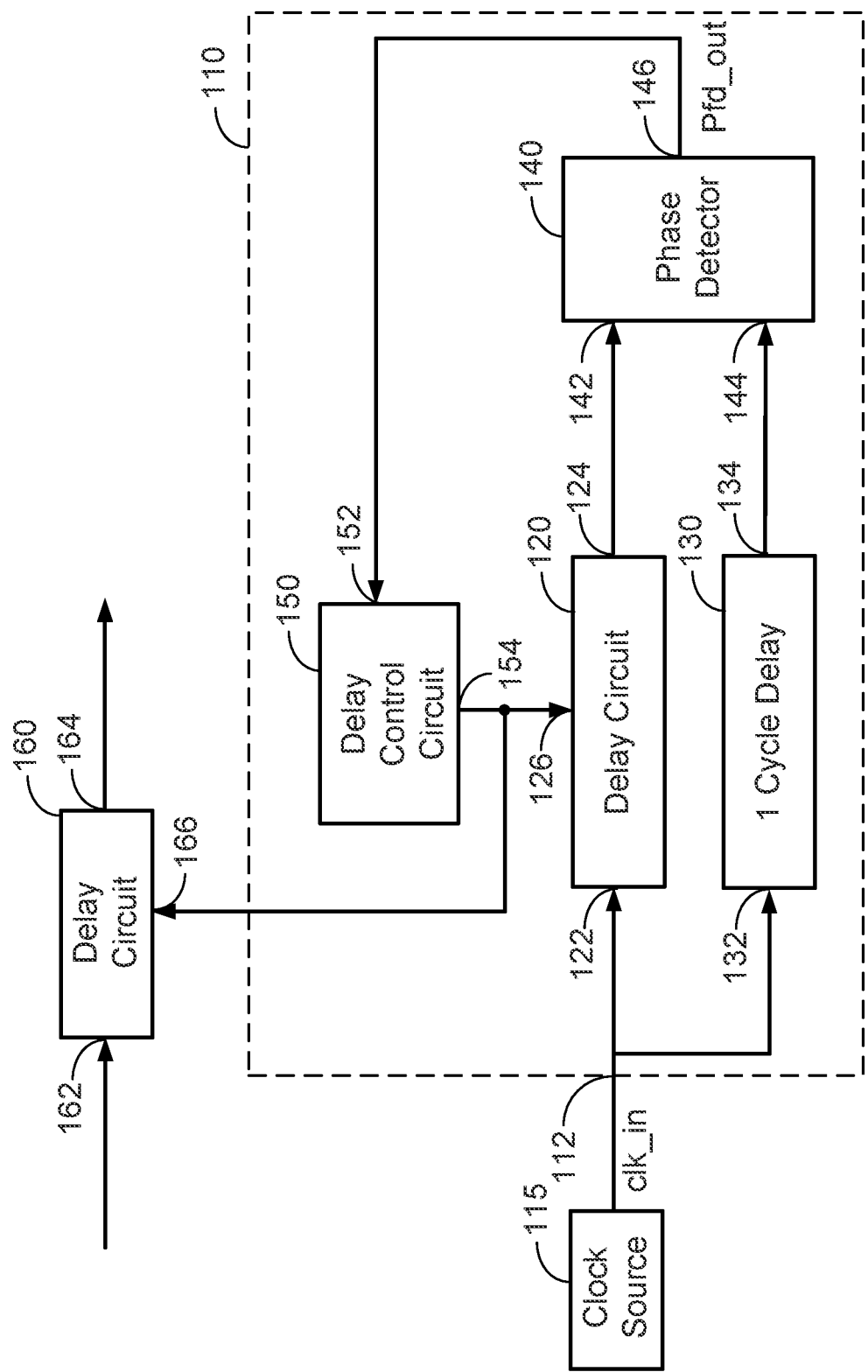
FIG. 1 shows an example of a delay locked loop (DLL) and a delay circuit according to certain aspects of the present disclosure.

The delay of a delay circuit may be controlled by a delay control signal that is generated using a delay locked loop (DLL). In this regard, FIG. 1 shows an example of a DLL 110 that may be used to generate a delay control signal for a delay circuit 160. In this example, the DLL 110 may be referred to as a master DLL and the delay circuit 160 may be referred to as a slave delay circuit. However, it is to be appreciated that the present disclosure is not limited to this terminology.

In the example in FIG. 1, the DLL 110 has an input 112 configured to receive a clock signal ("clk_in"). As discussed further below, the DLL 110 uses the clock signal as a timing reference to generate the delay control signal for the delay circuit 160. In one example, the DLL 110 receives the clock signal from a clock source 115 coupled to the input 112 of the DLL 110.

The DLL 110 includes a delay circuit 120, a one cycle delay circuit 130, a phase detector 140 (also referred to as phase frequency detector), and a delay control circuit 150. In certain aspects, the delay circuit 120 may include delay buffers coupled in series (i.e., cascaded delay buffers). However, it is to be appreciated that the present disclosure is not limited to this example. The delay circuit 130 has an input 122 and an output 124. The input 122 of the delay circuit 120 is coupled to the input 112 of the DLL 110. The delay circuit 120 is configured to receive the clock signal at the input 122, delay the clock signal by a tunable delay, and output the delayed clock signal at the output 124. The delay circuit 120 also has a control input 126 configured to receive a delay control signal from the delay control circuit 150. As discussed further below, the tunable delay of the delay circuit 120 is controlled by the delay control signal from the delay control circuit 150.

The one cycle delay circuit 130 has an input 132 and an output 134. The input 132 of the one cycle delay circuit 130 is coupled to the input 112 of the DLL 110. The one cycle delay circuit 130 is configured to receive the clock signal at the input 132, delay the clock signal by one cycle (i.e., one period) of the clock signal, and output the one cycle delayed clock signal at the output 134. For example, the one cycle delay circuit 130 may include a latch (e.g., flip flop) that is clocked by the clock signal.

The phase detector 140 has a first input 142 coupled to the output 124 of the delay circuit 120, a second input 144 coupled to the output of the one cycle delay circuit 130, and an output 146. The phase detector 140 is configured to compare the phases of the delayed clock signal from the delay circuit 120 and the one cycle delayed clock signal, and output an output signal (labeled "Pfd_out") indicating the phase difference (i.e., phase error) between the delayed clock signal from the delay circuit 120 and the one cycle delayed clock signal. In one example, the phase detector 140 may be implemented with a bang-bang phase detector in which the output signal of the phase detector 140 indicates whether an edge of the delayed clock signal from the delay circuit 120 is late or early with respect to an edge of the one cycle delayed clock signal (i.e., indicates whether the delay of the delay circuit 120 is longer or shorter than one cycle of the clock signal). It is to be appreciated that the phase detector 140 is not limited to a bang-bang phase detector, and may be implemented with another type of phase detector.

The delay control circuit 150 has an input 152 coupled to the output 146 of the phase detector 140, and an output 154 coupled to the control input 126 of the delay circuit 120. The delay control circuit 150 is configured to receive the output signal from the phase detector 140 at the input 152, generate a delay control signal based on the received output signal, and output the delay control signal to the delay circuit 120 via the output 154. In certain aspects, the delay control circuit 150 is configured to tune (i.e., adjust) the delay of the delay circuit 120 using the delay control signal until the phase difference between the delayed clock signal from the delay circuit 120 and the one cycle delayed clock signal is approximately zero. When the phase difference (i.e., phase error) is approximately zero, the delay of the delay circuit 120 is approximately equal to one cycle (i.e., one period) of the clock signal. Thus, in this example, the DLL 110 locks when the delay of the delay circuit 120 is approximately equal to one cycle (i.e., one period) of the clock signal.

The delay control signal generated by the delay control circuit 150 may also be sent to delay circuit 160 to control a tunable delay of the delay circuit 160, as shown in FIG. 1. In this example, the delay circuit 160 has an input 162, an output 164, and a control input 166 coupled to output 154 of the delay control circuit 150. The input 162 of the delay circuit 160 is configured to receive a signal (e.g., a data signal or another type of signal), delay the signal by the tunable delay of the delay circuit 160 to adjust the timing of the signal, and output the delayed signal at the output 164. In this example, the delay circuit 160 is configured to receive the delay control signal from the delay control circuit 150 at the control input 166, and set the delay of the delay circuit 160 based on the delay control signal. Thus, in this example, the delay of the delay circuit 160 is controlled by the delay control signal generated using the DLL 110.

In one example, each of the delay circuit 120 and the delay circuit 160 may include respective delay buffers coupled in series. In this example, the delay control circuit 150 tunes the delay control signal until the delay of the delay circuit 120 is approximately equal to one cycle (i.e., one period) of the clock signal, as discussed above. When this occurs, the delay of each delay buffer in the delay circuit 120 is approximately equal to 1/n of a cycle of the clock signal where n is the number of delay buffers in the delay circuit 120. In this example, the delay control signal may cause the delay of the delay circuit 160 to be approximately equal to m/n where m is the number of delay buffers in the delay circuit 160. However, it is to be appreciated that the present disclosure is not limited to this example.

It is also to be appreciated that, in some implementations, a second delay control circuit (not shown) may be coupled between the output 154 of the delay control circuit 150 and the control input 166 of the delay circuit 160. In these implementations, the second delay control circuit receives the delay control signal from the delay control circuit 150 and generates the delay control signal for the delay circuit 160 based on the received delay control signal.

Figure 2:
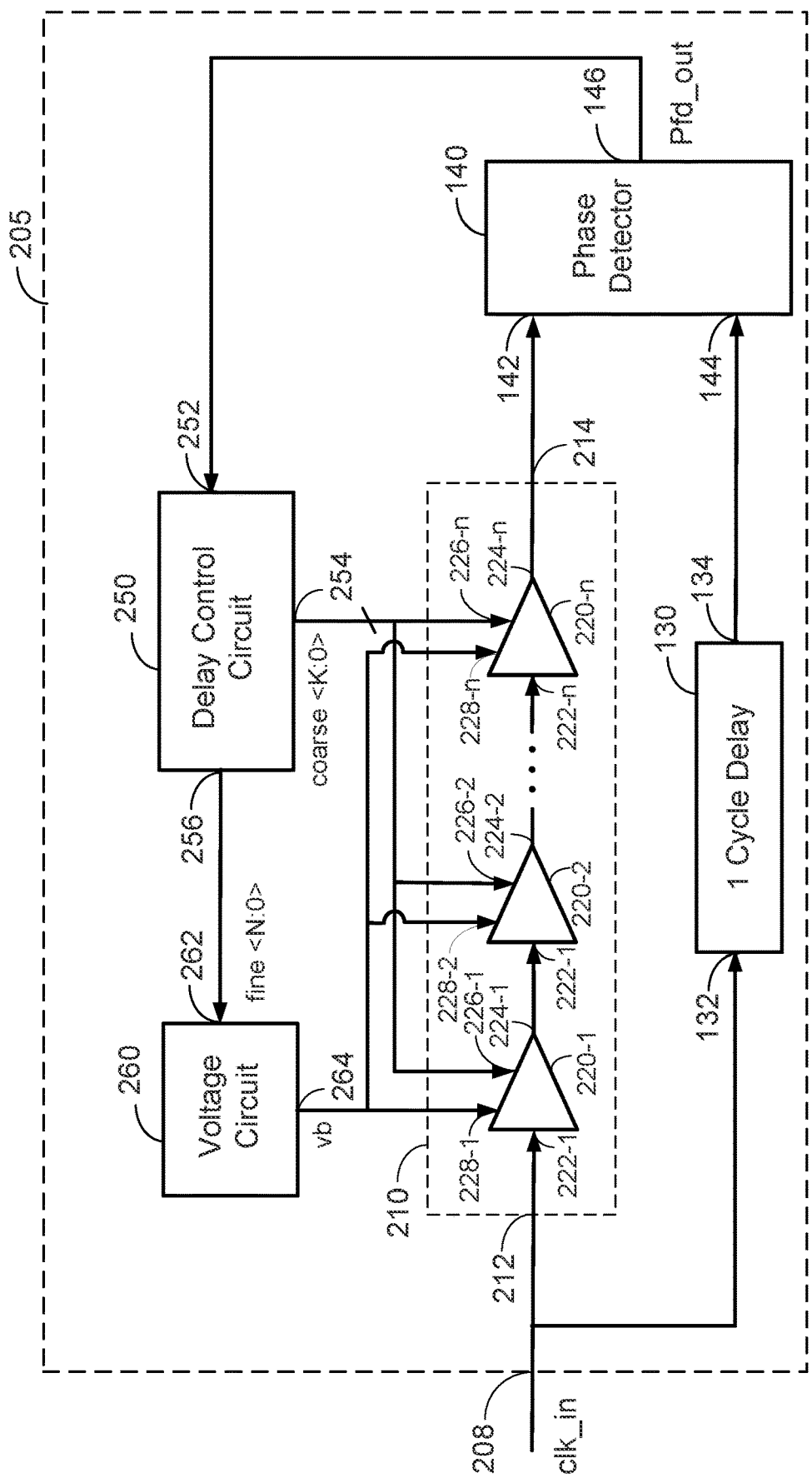
FIG. 2 shows an example of a DLL with coarse delay control and fine delay control according to certain aspects of the present disclosure.

FIG. 2 shows an example of a DLL 205 with coarse delay control and fine delay control according to certain aspects. The DLL 205 has an input 208 configured to receive a clock signal ("clk_in"). The DLL 205 may receive the clock signal, for example, from a clock source (e.g., clock source 115 shown in FIG. 1) coupled to the input 208. In certain aspects, the DLL 205 may be used as a master DLL to control the delay of one or more slave delay circuits (e.g., delay circuit 160 shown in FIG. 1).

In the example in FIG. 2, the DLL 205 includes the one cycle delay circuit 130 and the phase detector 140 discussed above. The DLL 205 also includes a delay circuit 210, a delay control circuit 250, and a voltage circuit 260 according to certain aspects. The delay circuit 210 has an input 212 and an output 214. The input 212 of the delay circuit 210 is coupled to the input 208 of the DLL 205, and the output 214 of the delay circuit 210 is coupled to the first input 142 of the phase detector 140. The delay circuit 210 is configured to receive the clock signal at the input 212, delay the clock signal by a tunable delay, and output the delayed clock signal at the output 214. In this example, the delay circuit 210 includes multiple delay buffers 220-1 to 220-$n$ coupled in series (i.e., a chain) to form a delay line. Each of the delay buffers 220-1 to 220-$n$ may also be referred to as a delay element, a delay stage, or another term. Each of the delay buffers 220-1 to 220-$n$ has a respective input 222-1 to 222-$n$ and a respective output 224-1 to 224-$n$. As shown in FIG. 2, the input 222-1 of the first delay buffer 220-1 in the delay line is coupled to the input 212 of the delay circuit 210, and the output 224-$n$ of the last delay buffer 220-$n$ in the delay line is coupled to the output 214 of the delay circuit 210. In this example, the delay of the delay circuit 210 may be approximately equal to the sum of the individual delays of the delay buffers 220-1 to 220-$n$. In this example, the delay circuit 160 may also include delay buffers coupled in series.

In the example shown in FIG. 2, each of the delay buffers 220-1 to 220-$n$ has a respective coarse control input 226-1 to 226-$n$ for coarse delay control, and a respective fine control input 228-1 to 228-$n$ for fine delay control. In one example, the coarse control input 226-1 to 226-$n$ of each of the delay buffers 220-1 to 220-$n$ is configured to receive a coarse delay control signal ("coarse <K:0>") for controlling the delay of the delay buffer 220-1 to 220-$n$ in coarse delay steps. The fine control input 228-1 to 228-$n$ of each of the delay buffers 220-1 to 220-$n$ is configured to receive one or more control voltages ("vb") for controlling the delay of the delay buffer 220-1 to 220-$n$ in fine delay steps. However, it is to be appreciated that the present disclosure is not limited to this example. It is to be appreciated that each of the coarse control inputs 226-1 to 226-$n$ may include multiple inputs (e.g., to receive multiple bits of the coarse delay control signal in parallel). Also, for implementations where the delay buffers 220-1 to 220-$n$ receive two or more control voltages, it is also to be appreciated that each of the fine control inputs 228-1 to 228-$n$ may include two or more inputs (e.g., to receive the two or more control voltages in parallel).

In the example shown in FIG. 2, the input 132 of the one cycle delay circuit 130 is coupled to the input 208 of the DLL 205, and the output 134 of the one cycle delay circuit 130 is coupled to the second input 144 of the phase detector 140. As discussed above, the one cycle delay circuit 130 is configured to delay the clock signal by one cycle (i.e., one period) of the clock signal, and output the one cycle delayed clock signal at the output 134.

The phase detector 140 is configured to compare the phases of the delayed clock signal from the delay circuit 210 and the one cycle delayed clock signal, and output an output signal (labeled "Pfd_out") indicating the phase difference (i.e., phase error) between the delayed clock signal from the delay circuit 210 and the one cycle delayed clock signal. In certain aspects, the output signal of the phase detector 140 may indicate whether an edge (e.g., rising edge) of the delayed clock signal from the delay circuit 210 is late or early with respect to an edge (e.g., rising edge) of the one cycle delayed clock signal (i.e., indicate whether the delay of the delay circuit 210 is longer or shorter than one cycle of the clock signal). For example, the output signal of the phase detector 140 may have a first logic value when the edge of the delayed clock signal from the delay circuit 210 is early with respect to the edge of the one cycle delayed clock signal (i.e., the delay of the delay circuit 210 is shorter than one cycle of the clock signal). Also, in this example, the output signal of the phase detector 140 may have a second logic value when the edge of the delayed clock signal from the delay circuit 210 is late with respect to the edge of the one cycle delayed clock signal (i.e., the delay of the delay circuit 210 is longer than one cycle of the clock signal). The first logic value may be one and the second logic value may be zero, or vice versa. In this example, the phase detector 140 may be implemented with a bang-bang phase detector, or another type of phase detector.

The delay control circuit 250 has an input 252, a first output 254, and a second output 256. The input 252 of the delay control circuit 250 is coupled to the output 146 of the phase detector 140, and the first output 254 of the delay control circuit 250 is coupled to the coarse control inputs 226-1 to 226-$n$ of the delay buffers 220-1 to 220-$n$. In certain aspects, the delay control circuit 250 is configured to generate the coarse delay control signal ("coarse <K:0>") based on the output signal of the phase detector 140, and output the coarse delay signal to the coarse control inputs 226-1 to 226-$n$ of the delay buffers 220-1 to 220-$n$ via the first output 254, as discussed further below. The delay control circuit 250 may also be configured to generate a fine delay control signal ("fine <N:0>") based on the output signal of the phase detector 140, and output the fine delay control signal to the voltage circuit 260, as also discussed further below. Note that N may be the same as or different from n (i.e., number of delay buffers 220-1 to 220-$n$). Also, N may be the same as or different from K.

The voltage circuit 260 has an input 262 coupled to the second output 256 of the delay control circuit 250, and an output 264 coupled to the fine control inputs 228-1 to 228-$n$ of the delay buffers 220-1 to 220-$n$. The voltage circuit 260 is configured to receive the fine delay control signal ("fine <N:0>") from the delay control circuit 250, and generate the one or more control voltages ("vb") based on the fine delay control signal. The voltage circuit 260 is also configured to output the one or more control voltages to the fine control inputs 228-1 to 228-$n$ of the delay buffers 220-1 to 220-$n$ via the output 264 to tune the fine delay of the delay buffers 220-1 to 220-$n$, as discussed further below. The voltage circuit 260 may be implemented with a digital-to-analog converter (DAC), or another type of circuit. An exemplary implementation of the voltage circuit 260 is discussed below with reference to FIG. 5.

Thus, the delay circuit 210 sets the coarse delay of the delay circuit 210 based on the coarse delay control signal ("coarse <K:0>") from the delay control circuit 250, in which the coarse delay of the delay circuit 210 may be approximately equal to the sum of the coarse delays of the delay buffers 220-1 to 220-$n$.

Also, the delay circuit 210 sets the fine delay of the delay circuit 210 based on the one or more control voltages ("vb") from the voltage circuit 260, in which the fine delay of the delay circuit 210 may be approximately equal to the sum of the fine delays of the delay buffers 220-1 to 220-$n$, wherein the fine delay of the delay circuit 210 is less than the coarse delay of the delay circuit 210 (e.g., less than one coarse delay step). The delay of the delay circuit 210 may be equal to the sum of the coarse delay of the delay circuit 210 and the fine delay of the delay circuit 210.

To lock the DLL 205, the delay control circuit 250 may be configured to tune the delay of the delay circuit 210 using the coarse delay control signal and the fine delay control signal until the phase difference (i.e., phase error) between the delayed clock signal from the delay circuit 210 and the one cycle delayed clock signal is approximately zero. When the DLL 205 locks, the delay of the delay circuit 210 is approximately equal to one cycle (i.e., one period) of the clock signal. In certain aspects, the delay control circuit 250 may lock the DLL 205 by performing the following operations. The delay control circuit 250 may first sweep the coarse delay control signal ("coarse <K:0>") until the output signal of the phase detector 140 toggles (e.g., toggles from the first logic value to the second logic value). The delay control circuit 250 may then decrease the coarse delay signal by one coarse delay step. The delay control circuit 250 may then sweep the fine delay control signal ("fine <N:0>") until the output signal of the phase detector 140 toggles. At this point the DLL 205 may be locked. Examples of the above operations for locking the DLL 205 are discussed further below according to certain aspects.

Figure 3:
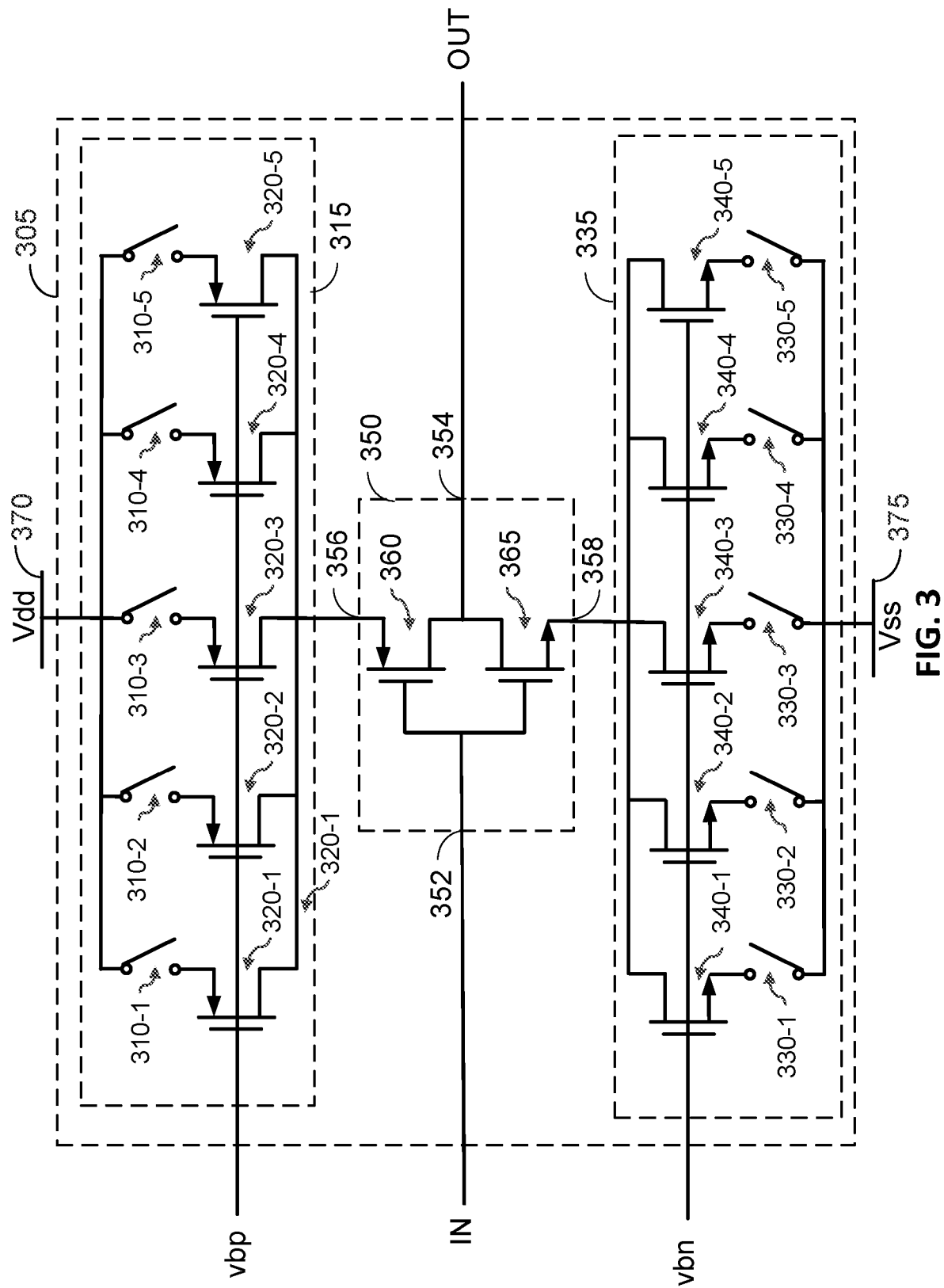
FIG. 3 shows an exemplary implementation of a delay buffer according to certain aspects of the present disclosure.

FIG. 3 shows an exemplary implementation of a delay buffer 305 according to certain aspects. Each of the delay buffers 220-1 to 220-n shown in FIG. 2 may be implemented with a respective instance of the exemplary delay buffer 305, or a respective cascade of two or more instances of the exemplary delay buffer 305. Buffers in the delay circuit 160 may also be implemented with instances of the exemplary delay buffer 305. In this example, the one or more control voltages from the voltage circuit 260 includes control voltage vbp and control voltage vbn. The control voltages vbp and vbn may also be referred to as bias voltages.

In this example, the delay buffer 305 includes a current-controlled delay device 350, a first current circuit 315, and a second current circuit 335 according to certain aspects. The delay device 350 has an input 352, an output 354, a first current terminal 356, and a second current terminal 358. The delay device 350 is configured to receive the clock signal at the input 352, delay the clock signal by the delay of the delay device 350, and output the delayed clock signal at the output 354. As discussed further below, the delay of the delay device 350 depends on the currents flowing through the current terminals 356 and 358, which are controlled by the current circuits 315 and 335 based on the coarse delay control signal ("coarse <K:0>") and the control voltages vbp and vbn. It is to be appreciated that the delay device 350 may itself also be referred to as a delay buffer, a delay element, or another term.

In the example shown in FIG. 3, the delay device 350 includes an inverter including a p-type transistor 360 (e.g., p-type field effect transistor (PFET)) and an n-type transistor 365 (e.g., n-type field effect transistor (NFET)). In this example, the source of the p-type transistor 360 is coupled to the first current terminal 356, the gate of the p-type transistor 360 is coupled to the input 352, and the drain of the p-type transistor 360 is coupled to the output 354. Also, in this example, the source of the n-type transistor 365 is coupled to the second current terminal 358, the gate of the n-type transistor 365 is coupled to the input 352, and the drain of the n-type transistor 365 is coupled to the output 354. It is to be appreciated that the delay device 350 is not limited to an inverter, and may be implemented with another type of delay device with a current-controlled delay.

In the example shown in FIG. 3, the first current circuit 315 includes a first set of transistors 320-1 to 320-5 and a first set of switches 310-1 to 310-5 according to certain aspects. In this example, each of the transistors 320-1 to 320-5 is coupled in series with a respective one of the switches 310-1 to 310-5 between a supply rail 370 and the first current terminal 356 of the delay device 350. For instance, transistor 320-1 and switch 310-1 are coupled in series between the supply rail 370 and the first current terminal 356, transistor 320-2 and switch 310-2 are coupled in series between the supply rail 370 and the first current terminal 356, and so forth. The supply rail 370 has a supply voltage Vdd, which may be provided by a power distribution network. It is to be appreciated that the number of transistors 320-1 to 320-5 and the number of switches 310-1 to 310-5 are not limited to the example shown in FIG. 3.

In certain aspects, the transistors 320-1 to 320-5 are binary weighted. For example, the widths (e.g., channel or gate widths) of the transistors 320-1 to 320-5 may be binary weighted, in which the widths of the transistors 320-1 to 320-5 differ from one another by powers of two. For example, the width of transistor 320-2 may be twice (i.e., $2^1$) the width of transistor 320-1, the width of transistor 320-3 may be four times (i.e., $2^2$) the width of transistor 320-1, the width of transistor 320-4 may be eight times (i.e., $2^3$) the width of transistor 320-1, and the width of transistor 320-5 may be sixteen times (i.e., $2^4$) the width of transistor 320-1. It is to be appreciated that, in some implementations, each of the transistors 320-2 to 320-5 shown in FIG. 3 may be physically implemented on a chip (i.e., die) with one transistor or with two or more transistors coupled in parallel. In these implementations, the width (e.g., channel or gate width) of a transistor depends on the number of parallel transistors in the transistor. For example, a transistor including a larger number of parallel transistors may have a larger width than a transistor including a smaller number of parallel transistors. In this example, the width of a transistor may be equal to a sum of the widths of the parallel transistors in the transistor.

The switches 310-1 to 310-5 are used to select which ones of the transistors 320-1 to 320-5 are enabled or disabled based on the coarse delay control signal ("coarse <K:0>"). In this example, each of the transistors 320-1 to 320-5 is enabled or disabled depending on the on/off state of the respective one of the switches 310-1 to 310-5. More particularly, each of the transistors 320-1 to 320-5 is enabled when the respective one of the switches 310-1 to 310-5 is turned on (i.e., closed) and each of the transistors 320-1 to 320-5 is disabled when the respective one of the switches 310-1 to 310-5 is turn off (i.e., opened). In this example, the coarse delay control signal ("coarse <K:0>") enables coarse adjustments to the delay of the delay device 350 by controlling which ones of the transistors 320-1 to 320-5 are enabled or disabled by the switches 310-1 to 310-5. For example, the coarse delay control signal ("coarse <K:0>") may be a digital code including multiple bits, in which each of the bits corresponds to a respective one of the transistors 320-1 to 320-5. In this example, each bit may enable the respective one of the transistors 320-1 to 320-5 by turning on the respective one of the switches 310-1 to 310-5 when the bit has a first logic value, and each bit may disable the respective one of the transistors 320-1 to 320-5 by turning off the respective one of the switches 310-1 to 310-5 when the bit has a second logic value. The first logic value may be one and the second logic value may be zero, or vice versa. Thus, in this example, the delay control circuit 250 may make coarse adjustments to the delay of the delay device 350 (and hence the delay of the delay circuit 210) by changing the bit values of the coarse delay control signal ("coarse <K:0>") accordingly.

In the example shown in FIG. 3, the gates of the transistors 320-1 to 320-5 are biased by the control voltage vbp. In this example, the voltage circuit 260 makes fine adjustments to the delay of the delay device 350 (and hence the delay of the delay circuit 210) by adjusting the control voltage vbp based on the fine delay control signal ("fine <N:0>") from the delay control circuit 250. For example, the fine delay control signal ("fine <N:0>") may be a digital code including multiple bits. In this example, the voltage circuit 260 sets the control voltage vbp to different voltage levels for different bit values of the fine delay control signal ("fine <N:0>"). Thus, in this example, the delay control circuit 250 may make fine adjustments to the delay of the delay device 350 (and hence the delay of the delay circuit 210) by changing the bit values of the fine delay control signal ("fine <N:0>") accordingly.

In the example shown in FIG. 3, each of the transistors 320-1 to 320-5 is implemented with a respective p-type transistor (e.g., PFET). In this example, setting the control voltage vbp to a higher voltage level decreases the current flow through the transistors 320-1 to 320-5 that are enabled by the switches 310-1 to 310-5, which increases the delay of the delay device 350. Setting the control voltage vbp to a lower voltage level increases the current flow through the transistors 320-1 to 320-5 that are enabled by the switches 310-1 to 310-5, which decreases the delay of the delay device 350. Thus, in this example, the delay control circuit 250 may increase the delay of the delay device 350 by setting the bits of the fine delay control signal ("fine <N:0>") to bit values corresponding to a higher voltage level for vbp, and decrease the delay of the delay device 350 by setting the bits of the fine delay control signal ("fine <N:0>") to bit values corresponding to a lower voltage level for vbp.

In the example shown in FIG. 3, the second current circuit 335 includes a second set of transistors 340-1 to 340-5 and a second set of switches 330-1 to 330-5 according to certain aspects. In this example, each of the transistors 340-1 to 340-5 is coupled in series with a respective one of the switches 330-1 to 330-5 between the second current terminal 358 of the delay device 350 and a low rail 375. For instance, transistor 340-1 and switch 330-1 are coupled in series between the second current terminal 358 and the low rail 375, transistor 340-2 and switch 330-2 are coupled in series between the second current terminal 358 and the low rail 375, and so forth. The low rail 375 has a lower potential than the supply rail 370, and may be coupled to ground. It is to be appreciated that the number of transistors 340-1 to 340-5 and the number of switches 330-1 to 330-5 are not limited to the example shown in FIG. 3.

In certain aspects, the transistors 340-1 to 340-5 are binary weighted. For example, the widths (e.g., channel or gate widths) of the transistors 340-1 to 340-5 may be binary weighted, in which the widths of the transistors 340-1 to 340-5 differ from one another by powers of two.

The switches 330-1 to 330-5 are used to select which ones of the transistors 340-1 to 340-5 are enabled or disabled based on the coarse delay control signal ("coarse <K:0>"). In this example, each of the transistors 340-1 to 340-5 is enabled or disabled depending on the on/off state of the respective one of the switches 330-1 to 330-5. More particularly, each of the transistors 340-1 to 340-5 is enabled when the respective one of the switches 330-1 to 330-5 is turned on (i.e., closed) and each of the transistors 340-1 to 340-5 is disabled when the respective one of the switches 330-1 to 330-5 is turn off (i.e., opened). In this example, the coarse delay control signal ("coarse <K:0>") enables coarse adjustments to the delay of the delay device 350 by controlling which ones of the transistors 340-1 to 340-5 are enabled or disabled by the switches 330-1 to 330-5. For example, the coarse delay control signal ("coarse <K:0>") may include multiple bits, in which each of the bits corresponds to a respective one of the transistors 340-1 to 340-5. In this example, each bit may enable the respective one of the transistors 340-1 to 340-5 by turning on the respective one of the switches 330-1 to 330-5 when the bit has a first logic value, and each bit may disable the respective one of the transistors 340-1 to 340-5 by turning off the respective one of the switches 330-1 to 330-5 when the bit has a second logic value. The first logic value may be one and the second logic value may be zero, or vice versa. Thus, in this example, the delay control circuit 250 may make coarse adjustments to the delay of the delay device 350 (and hence the delay of the delay circuit 210) by changing the bit values of the coarse delay control signal ("coarse <K:0>") accordingly.

In the example shown in FIG. 3, the gates of the transistors 340-1 to 340-5 are biased by control voltage vbn. In this example, the voltage circuit 260 makes fine adjustments to the delay of the delay device 350 (and hence the delay of the delay circuit 210) by adjusting the control voltage vbn based on the fine delay control signal ("fine <N:0>") from the delay control circuit 250. For example, the fine delay control signal ("fine <N:0>") may include multiple bits. In this example, the voltage circuit 260 sets the control voltage vbn to different voltage levels for different bit values of the fine delay control signal ("fine <N:0>"). Thus, in this example, the delay control circuit 250 may make fine adjustments to the delay of the delay device 350 (and hence the delay of the delay circuit 210) by changing the bit values of the fine delay control signal ("fine <N:0>") accordingly.

In the example shown in FIG. 3, each of the transistors 340-1 to 340-5 is implemented with a respective n-type transistor (e.g., NFET). In this example, setting the control voltage vbn to a lower voltage level decreases the current flow through the transistors 340-1 to 340-5 that are enabled by the switches 330-1 to 330-5, which increases the delay of the delay device 350. Setting the control voltage vbn to a higher voltage level increases the current flow through the transistors 340-1 to 340-5 that are enabled by the switches 330-1 to 330-5, which decreases the delay of the delay device 350. Thus, in this example, the delay control circuit 250 may increase the delay of the delay device 350 by setting the bits of the fine delay control signal ("fine <N:0>") to bit values corresponding to a lower voltage level for vbn, and decrease the delay of the delay device 350 by setting the bits of the fine delay control signal ("fine <N:0>") to bit values corresponding to a higher voltage level for vbn.

It is to be appreciated that one of the first current circuit 305 and the second current circuit 335 may be omitted in some applications. For example, in implementations where the second current circuit 335 is omitted, the second current terminal of the delay device 350 may be coupled to the low rail 375.

In this example, the delay control circuit 250 and the voltage circuit 260 make fine delay adjustments by adjusting the voltage level of vbn and/or the voltage level of vbp. Adjusting voltage levels to adjust delay reduces glitches compared with turning switches on and off in the current circuits 315 and 335 to adjust delay (which may cause glitches). When the DLL 205 and the delay circuit 160 are used to adjust timing in a data interface, this allows the delay control circuit 250 and the voltage circuit 260 to make fine adjustments to the delay circuit 160 during data traffic with reduced glitches, which reduces disruptions in the data traffic. The coarse delay adjustment allows the delay control circuit 250 to lock the DLL 205 over a wider frequency range, which allows the delay circuit 160 to be used for data traffic over a wider range of data rates.

Figure 4:
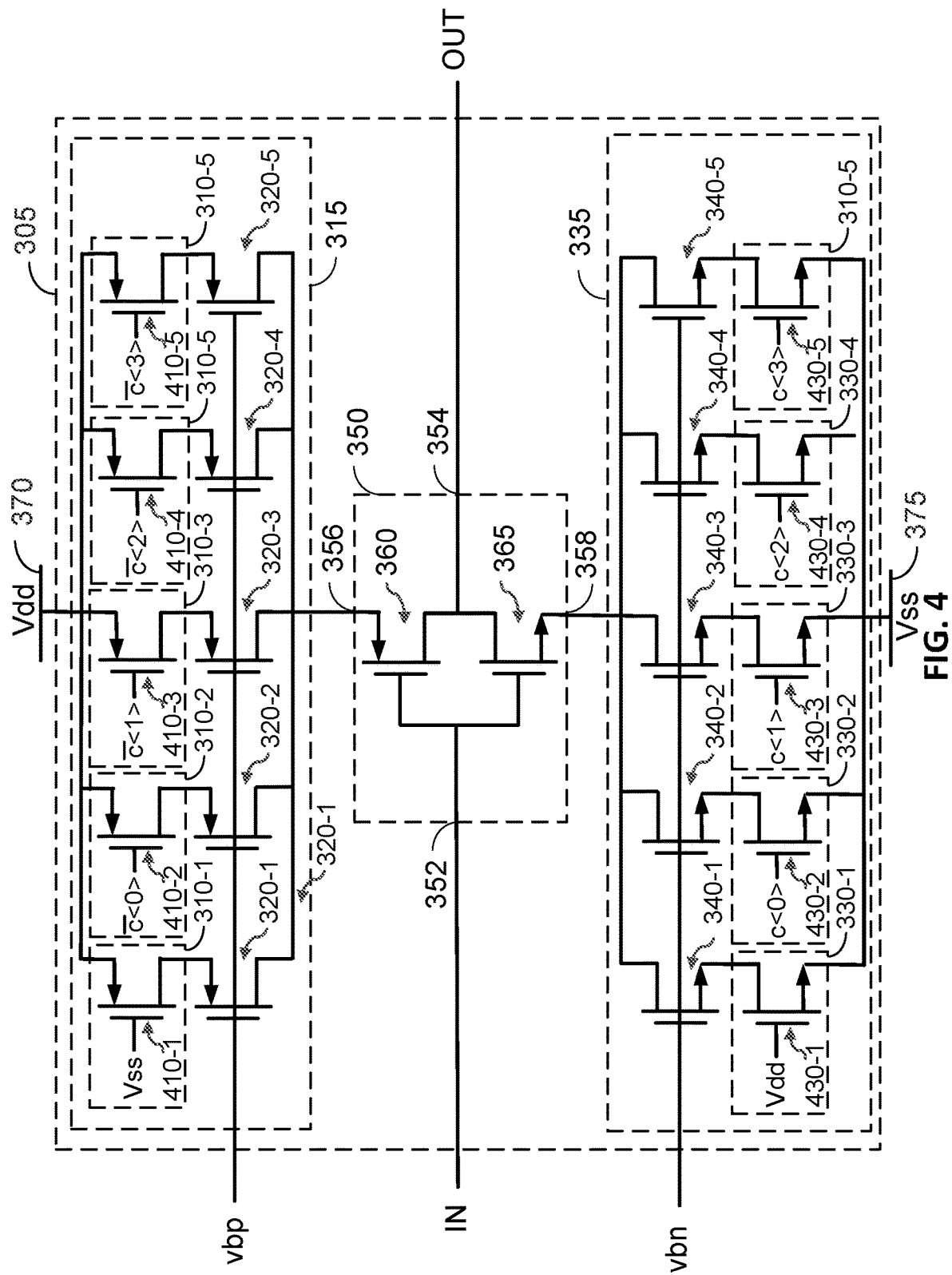
FIG. 4 shows an exemplary implementation of switches in the delay buffer according to certain aspects of the present disclosure.

Each of the switches 310-1 to 310-5 and 330-1 to 330-5 may be implemented with a transistor, a transmission gate, or another type of switch. FIG. 4 shows an example in which each of the switches 310-1 to 310-5 in the first current circuit 315 includes a respective one of transistors 410-1 to 410-5, and each of the switches 330-1 to 330-5 in the second current circuit 335 includes a respective one of transistors 430-1 to 430-5. In this example, each of the transistors 410-1 to 410-5 is a p-type transistor (e.g., PFET) and each of the transistors 430-1 to 430-5 is an n-type transistor (e.g., NFET). However, it is to be appreciated that the present disclosure is not limited to this example.

In the example in FIG. 4, the coarse delay control signal ("coarse <3:0>") includes bits c<0>, c<1>, c<2>, and c<3>. Although the coarse delay control signal includes four bits in this example (i.e., K=3), it is to be appreciated that the coarse delay control signal ("coarse <K:0>") is not limited to this example and may have a different number of bits in other examples. In this example, the bit c<0> is input to the gate of transistor 430-2 and the inverse of bit c<0> is input to the gate of transistor 410-2, the bit c<1> is input to the gate of transistor 430-3 and the inverse of bit c<1> is input to the gate of transistor 410-3, the bit c<2> is input to the gate of transistor 430-4 and the inverse of bit c<2> is input to the gate of transistor 410-4, and the bit c<3> is input to the gate of transistor 430-5 and the inverse of bit c<3> is input to the gate of transistor 410-5. Note that in FIG. 4, the inverse of a bit is indicated by an upper bar. The inverse of the coarse bits c<0>, c<1>, c<2>, and c<3> may be generated from the coarse bits c<0>, c<1>, c<2>, and c<3>. using inverters (not shown).

In this example, each of the transistors 430-2 to 430-5 is turned on when the corresponding bit is one and is turned off when the corresponding bit is zero, and each of transistors 410-2 to 410-5 is turned on when the corresponding inverse bit is zero and is turned off when the corresponding inverse bit is one. For example, transistors 410-2 and 430-2 turn on when bit c<0> is one and the inverse of bit c<0> is zero (which enables respective transistors 320-2 and 340-2), and transistors 410-2 and 430-2 turn off when bit c<0> is zero and the inverse of bit c<0> is one (which disables respective transistors 320-2 and 340-2). Transistors 410-3 and 430-3 turn on when bit c<1> is one and the inverse of bit c<1> is zero (which enables respective transistors 320-3 and 340-3), and transistors 410-3 and 430-3 turn off when bit c<1> is zero and the inverse of bit c<1> is one (which disables respective transistors 320-3 and 340-3). Transistors 410-4 and 430-4 turn on when bit c<2> is one and the inverse of bit c<2> is zero (which enables respective transistors 320-4 and 340-4), and transistors 410-4 and 430-4 turn off when bit c<2> is zero and the inverse of bit c<2> is one (which disables respective transistors 320-4 and 340-4). Transistors 410-5 and 430-5 turn on when bit c<3> is one and the inverse of bit c<3> is zero (which enables respective transistors 320-5 and 340-5), and transistors 410-5 and 430-5 turn off when bit c<3> is zero and the inverse of bit c<3> is one (which disables respective transistors 320-5 and 340-5). Thus, in this example, the delay control circuit 250 may select which ones of the transistors 320-1 to 320-5 and 340-1 to 340-5 are enabled or disabled by the transistors 410-2 to 410-5 and 430-2 to 430-5 by setting the bit values of the coarse bits c<0>, c<1>, c<2>, and c<3> accordingly.

In the example shown in FIG. 4, the gate of transistor 410-1 is coupled to the low rail 375, which keeps transistor 410-1 turned on and transistor 320-1 enabled. Also, the gate of transistor 430-1 to coupled to the supply rail 370, which keeps transistor 430-1 turned on and transistor 340-1 enabled. This may be done, for example, to maintain minimum amounts of currents flowing through the current terminals 356 and 358 (e.g., when the coarse bits c<0>, c<1>, c<2>, and c<3> are all zeros). However, it is to be appreciated that the present disclosure is not limited to this example.

As discussed above, the transistors 320-1 to 320-5 and 340-1 to 340-5 may be binary weighted. In this example, the transistors 410-2 to 410-5 and 430-2 to 430-5 may also be binary weighted in which each of the transistors 410-2 to 410-5 and 430-2 to 430-5 may have the same weight as the respective one of the transistors 320-1 to 320-5 and 340-1 to 340-5. However, it is to be appreciated that the transistors 410-2 to 410-5 and 430-2 to 430-5 need not be binary weighted.

Figure 5:
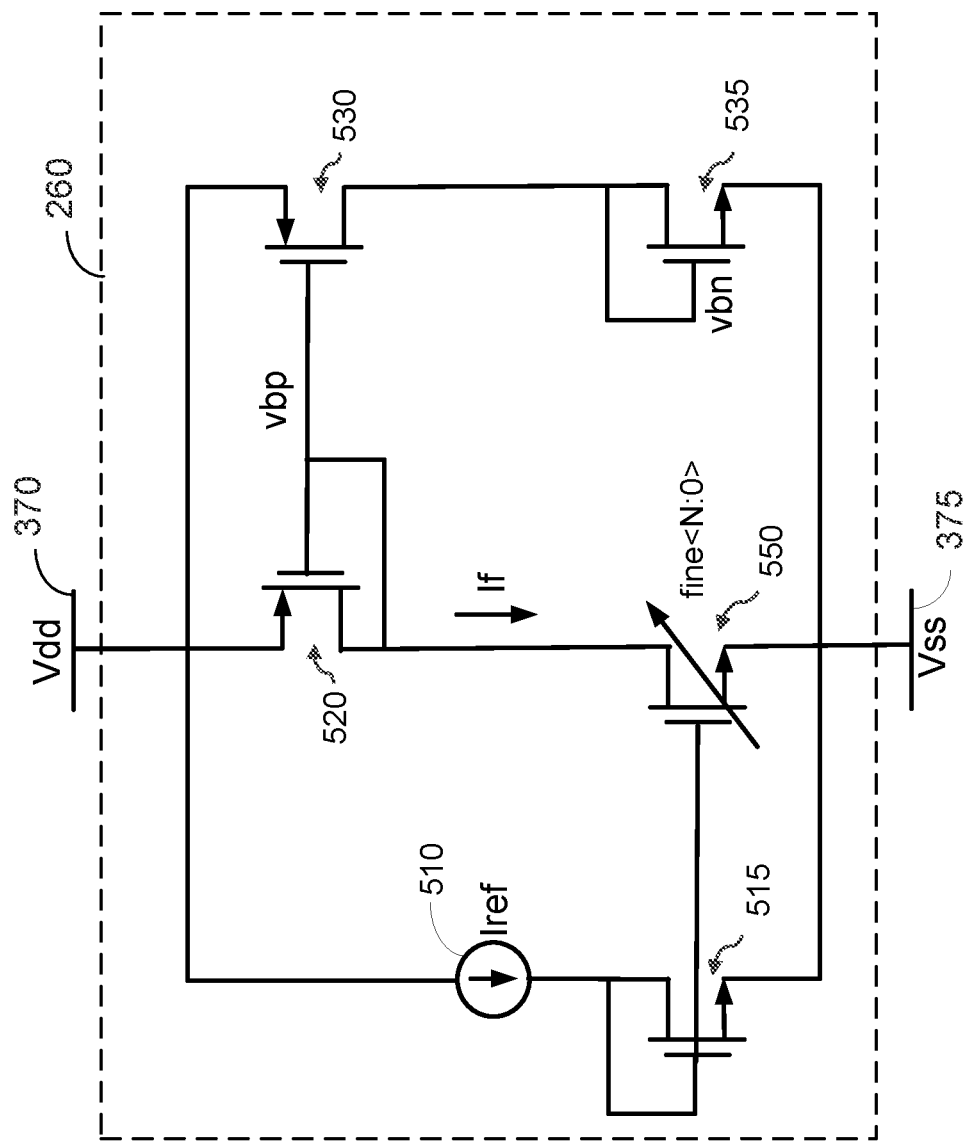
FIG. 5 shows an exemplary implementation of a voltage circuit according to certain aspects of the present disclosure.

FIG. 5 shows an exemplary implementation of the voltage circuit 260 according to certain aspects. In this example, the voltage circuit 260 includes a current source 510, a first transistor 515, a second transistor 520, a third transistor 530, a fourth transistor 535, and a variable transistor 550. In one example, the variable transistor 550 has a variable channel width that is controlled by the fine delay control signal ("fine <N:0>") from the delay control circuit 250, as discussed further below.

In this example, the current source 510 is coupled between the supply rail 370 and the drain of the first transistor 515. The gate of the first transistor 515 is coupled to the drain of the first transistor 515, and the source of the first transistor 515 is coupled to the low rail 375. The gate of the variable transistor 550 is coupled to the gate of the first transistor 515, and the source of the variable transistor 550 is coupled to the low rail 375. The drain of the second transistor 520 is coupled to the drain of the variable transistor 550, the gate of the second transistor 520 is coupled to the drain of the second transistor 520, and the source of the second transistor 520 is coupled to the supply rail 370. The source of the third transistor 530 is coupled to the supply rail 370, and the gate of the third transistor 530 is coupled to the gate of the second transistor 520. The drain of the fourth transistor 535 is coupled to the drain of the third transistor 530, the gate of the fourth transistor 535 is coupled to the drain of the fourth transistor 535, and the source of the fourth transistor 535 is coupled to the low rail 375. In the example in FIG. 5, the first transistor 515, the variable transistor 550, and the fourth transistor 535 are n-type transistors (e.g., NFETs) and the second transistor 520 and the third transistor 530 are p-type transistors (e.g., PFETs). However, it is to be appreciated that the present disclosure is not limited to this example.

In operation, the current source 510 is configured to generate a reference current Iref, which flows through the first transistor 515. This causes the first transistor 515 to generate a gate bias voltage at the gates of the first transistor 515 and the variable transistor 550 based of the reference current Iref. The gate bias causes the variable transistor 550 to produce a current If that is proportional to the reference current Iref. The magnitude of the current If is controlled by the fine delay control signal ("fine <N:0>"), which controls the channel width of the variable transistor 550. For example, when the fine delay control signal reduces the channel width, the current If decreases. When the fine delay control signal increases the channel width, the current If increases.

The current If flows through the second transistor 520, causing the second transistor 520 to generate a gate bias voltage at the gates of the second transistor 520 and the third transistor 530 based on the current If. In the example in FIG.

5, the gate bias voltage at the gates of the second transistor 520 and the third transistor 530 provide the control voltage vbp discussed above. The current If flowing through the second transistor 520 is mirrored (i.e., replicated) at the third transistor 530 producing a mirrored current at the drain of the third transistor 530. The mirrored current from the third transistor 530 flows through the fourth transistor 535, causing the fourth transistor 535 to generate a gate bias voltage at the gate of the fourth transistor 535 based on the mirrored current. The gate bias voltage at the gate of the fourth transistor 535 provides the control voltage vbn discussed above.

In this example, the fine delay control signal ("fine <N:0>") from the delay control circuit 250 (shown in FIG. 2) controls the channel width of the variable transistor 550, which, in turn, controls the current If and the control voltages vbp and vbn that are generated based on the current If. For example, when the fine delay control signal reduces the channel width of the variable transistor 550, the current If decreases which causes vbp to increase and vbn to decrease. In this case, the fine delay of the delay device 350 increases. When the fine delay control signal increases the channel width of the variable transistor 550, the current If increases which causes vbp to decrease and vbn to increase. In this case, the fine delay of the delay device 350 decreases.

Figure 6:
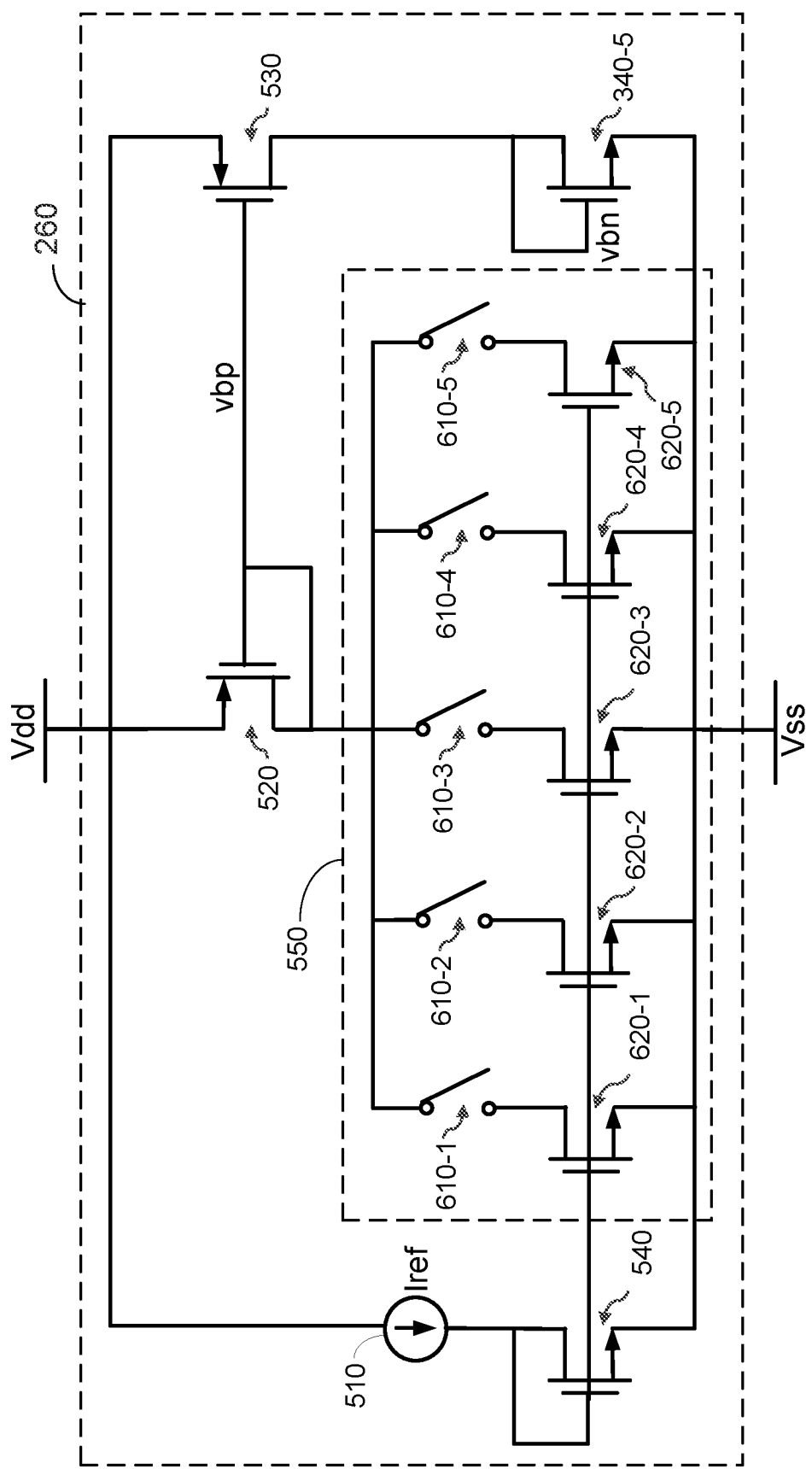
FIG. 6 shows an exemplary implementation of a variable transistor according to certain aspects of the present disclosure.

FIG. 6 shows an exemplary implementation of the variable transistor 550. In this example, the variable transistor 550 includes transistors 620-1 to 620-5 and switches 610-1 to 610-5, in which each of the transistors 620-1 to 620-5 is coupled in series with a respective one of the switches 610-1 to 610-5 between the drain and the source of the variable transistor 550. The gates of the transistors 620-1 to 620-5 are coupled to the gate of the variable transistor 550, which is coupled to the gate of the first transistor 540 in this example.

In this example, the fine delay control signal ("fine <N:0>") controls the channel width of the variable transistor 550 by controlling which one of the transistors 620-1 to 620-5 are enabled using the switches 610-1 to 610-5. In certain aspects, enabling more of the transistors 620-1 to 620-5 increases the effective channel width of the variable transistor 550 while enabling fewer of the transistors 620-1 to 620-5 decreases the effective channel width of the variable transistor 550. In one example, the fine delay control signal ("fine <N:0>") includes multiple bits, in which each of the bits corresponds to a respective one of the switches 610-1 to 610-5. In this example, the bit value of each bit of the fine delay control signal controls the on/off state of the respective one of the switches 610-1 to 610-5. For example, each of the switches 610-1 to 610-5 may turned on when the respective bit is one and turned off when the respective bit is zero, or vice versa.

As discussed above, increasing the channel width of the variable transistor 550 decreases the fine delay of the delay device 350, and decreasing the channel width of the variable transistor 550 increases the fine delay of the delay device 350. Thus, to decrease the fine delay of the delay device 350, the delay control circuit 350 may set the bits of the fine delay control signal to bit values that increase the channel width of the variable transistor 550. To increase the fine delay of the delay device 350, the delay control circuit 250 may set the bits of the fine delay control signal to bit values that decrease the channel width of the variable transistor 550.

It is to be appreciated that the voltage circuit 260 is not limited to the exemplary implementations shown in FIGS. 5 and 6. For example, the voltage circuit 260 may be implemented with any one of a variety of digital-to-analog converters (DACs) configured to convert a digital signal (e.g., the fine delay control signal ("fine <N:0>") into one or more analog voltages (e.g., vbp and/or vbn).

Figure 7:
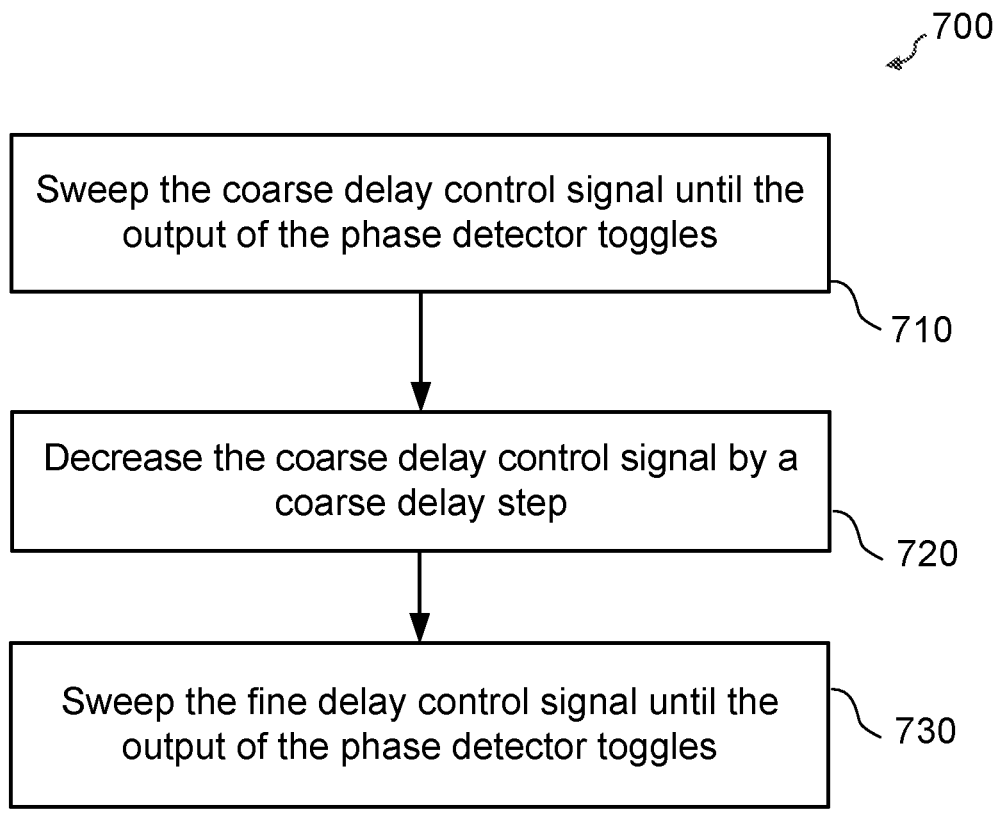
FIG. 7 is a flowchart illustrating a method for locking a delay locked loop (DLL) according to certain aspects of the present disclosure.

FIG. 7 illustrates a method 700 for locking the DLL 205 according to certain aspects. In this example, the output signal of the phase detector 140 indicates whether the delay of the delay circuit 210 is longer or shorter than one cycle of the clock signal. For example, the output signal may have a first logic value (e.g., one) when the delay of the delay circuit 210 is shorter than one clock cycle, and have a second logic value (e.g., zero) when the delay of the delay circuit 210 is longer than one clock cycle.

At block 710, the delay control circuit 250 sweeps the coarse delay control signal ("coarse <K:0>") until the output 146 of the phase detector 140 toggles (e.g., toggles from the first logic value to the second logic value). For example, sweeping the coarse delay control signal may include increasing the coarse delay in coarse delay steps using the coarse delay control signal.

At block 720, after the output of the phase detector 140 toggles, the delay control circuit 250 decreases the coarse delay control signal by one coarse delay step. At this point, the coarse delay control signal sets the coarse delay of the delay circuit 210 to the longest coarse delay that is shorter than one clock signal, and causes the output 146 of the phase detector 140 to toggle (e.g., toggle from the second logic value to the first logic value).

At block 730, the delay control circuit 250 sweeps the fine delay signal ("fine <N:0>") until the output 146 of the phase detector 140 toggles (e.g., toggles from the first logic value to the second logic value). For example, sweeping the fine delay control signal may include increasing the fine delay in fine delay steps, wherein one fine delay step is smaller than one coarse delay step. At this point, the DLL 205 may be locked.

Figure 8:
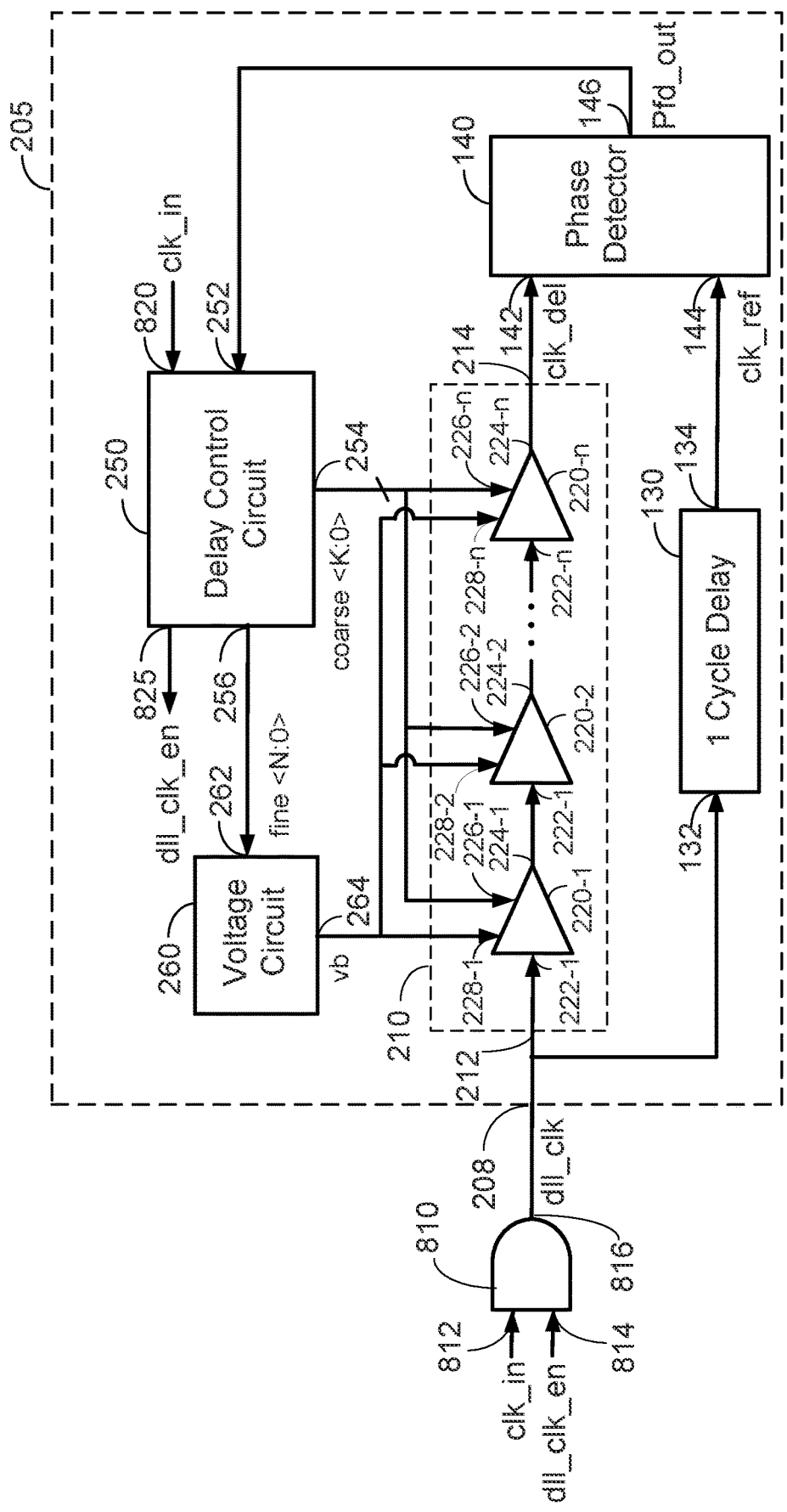
FIG. 8 shows an example of a clock gating circuit coupled to a DLL according to certain aspects of the present disclosure.

In certain aspects, the delay control circuit 250 may limit the number of clock pulses entering the DLL 205 at a time. In this regard, FIG. 8 shows an example of a clock gating circuit 810 coupled to the input 208 of the DLL. The clock gating circuit 810 has a first input 812 configured to receive the clock signal ("clk_in"), a second input 814 configured to receive a clock enable signal ("dll_clk_en"), and an output 816 coupled to the input 208 of the DLL 205. In the example shown in FIG. 8, the clock gating circuit 810 is implemented with an AND gate. However, it is to be appreciated that the present disclosure is not limited to this example.

In the example shown in FIG. 8, the delay control circuit 250 includes a clock input 820 and an enable output 825. The enable output 825 is coupled to the second input 814 of the clock gating circuit 810. The delay control circuit 250 is configured to receive the clock signal ("clk_in"), generate the clock enable signal ("dll_clk_en") based on the clock signal, and output the clock enable signal at the enable output 825. In this example, the delay control circuit 250 controls whether the clock gating circuit 810 gates the clock signal ("clk_in") using the clock enable signal ("dll_clk_en"). For the example where the clock gating circuit 810 is implemented with an AND gate, the delay control circuit 250 sets the clock enable signal high to cause the clock gating circuit 810 to pass the clock signal ("dll_clk") to the input 208 of the DLL 205, and sets the clock enable signal low to cause the clock gating circuit 810 to gate (i.e., block) the clock signal. However, it is to be appreciated that the present disclosure is not limited to this example.

In one example, the delay control circuit 250 causes the clock gating circuit 810 to pass m pulses of the clock signal ("clk_in") to the input 208 of the DLL at a time, where m is an integer. For example, the delay control circuit 250 may cause the clock gating circuit 810 to pass pulses of the clock signal ("clk_in") in groups of m pulses where adjacent groups of m pulses are separated by one or more pulses of the clock signal. In this example, the delay control circuit 250 may make one delay adjustment to the delay circuit 210 for each group of m pulses. Each delay adjustment may be either a coarse delay adjustment or a fine delay adjustment.

Figure 9:
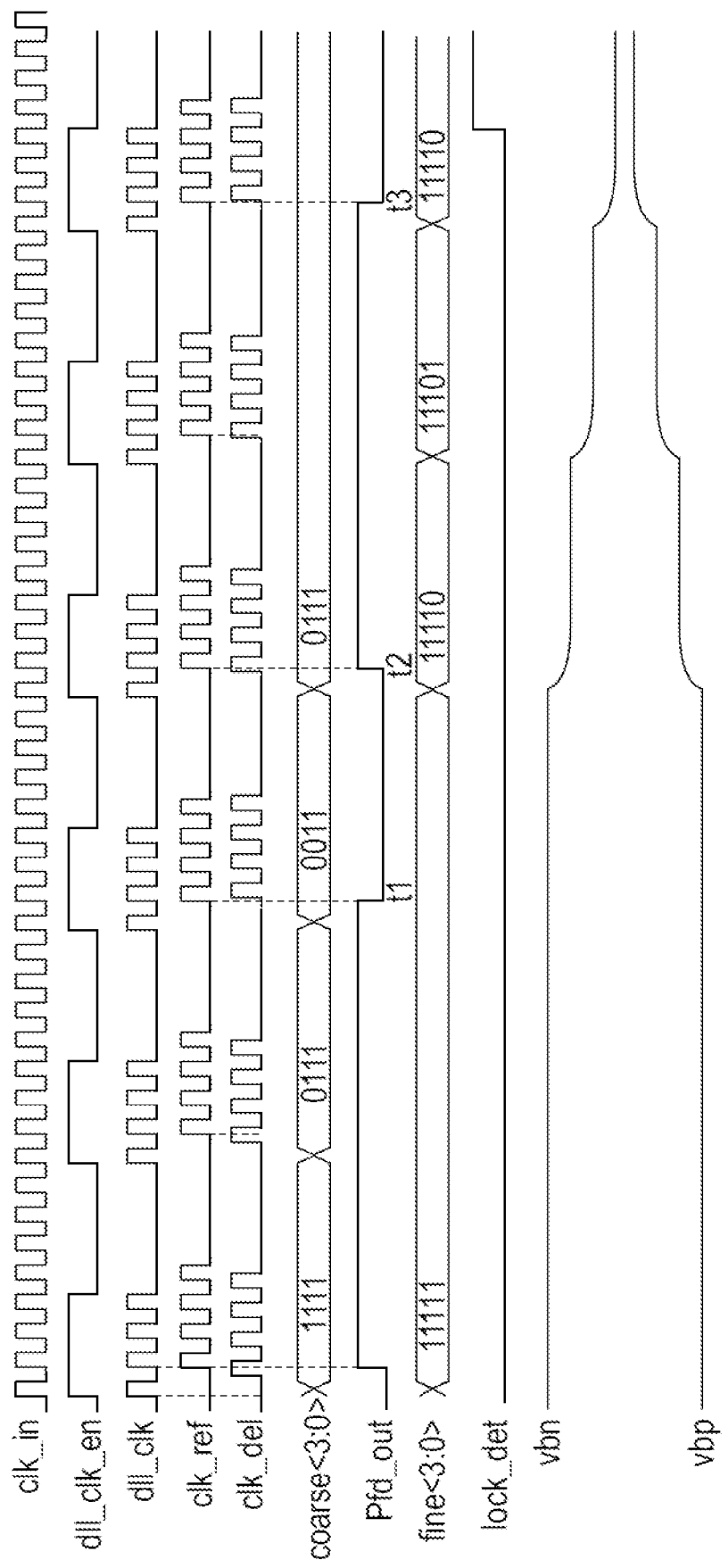
FIG. 9 is a timing diagram illustrating exemplary operations of a DLL according to certain aspects of the present disclosure.

FIG. 9 is a timing diagraming illustrating exemplary operations for locking the DLL 205 according to certain aspects. FIG. 9 shows examples of the clock signal ("clk_in") input to the clock gating circuit 810, the clock signal ("dll_clk") input to the DLL 205, the clock enable signal ("dll_clk_en"), the delayed clock signal ("clk_del") from the delay circuit 210, the one cycle delayed clock ("clk_ref"), the output signal ("Pfd_out") of the phase detector 140, the coarse delay control signal ("coarse <K:0>"), the fine delay control signal ("fine <N:0>"), and the control voltages vbn and vbp.

In the example shown in FIG. 9, the delay control circuit 250 causes the clock gating circuit 810 to pass pulses of the input clock signal ("clk_in") in groups of four pulses ("dll_clk") to the input 208 of the DLL 205. In this example, the clock gating circuit 810 passes the clock signal when the clock enable signal ("dll_clk_en") is high and gates (i.e., blocks) the clock signal when the clock enable signal ("dll_ckl_en") is low. However, it is to be appreciated that the present disclosure is not limited to this example.

The delay circuit 210 delays the clock signal ("dll_clk") by the delay of the delay circuit 210 and outputs delayed clock signal ("clk_del") to the first input 142 of the phase detector 140. The one cycle delay circuit 130 delays the clock signal ("dll_clk") by one cycle (i.e., one period) and outputs the one cycle delayed clock signal ("clk_ref") to the second input 144 of the phase detector 140. In this example, the output signal ("Pfd_out") of the phase detector 140 is one (i.e., high) when the delayed clock signal ("clk_del") is early with respect to the one cycle delayed clock signal ("clk_ref") and zero (i.e., low) when the delayed clock signal ("clk_del") is late with respect to the one cycle delayed clock signal ("clk_ref"). However, it is to be appreciated that the present disclosure is not limited to this example.

At the start of the timing diagram, the first rising edge of the delayed clock signal ("clk_del") is early with respect to the first rising edge of the one cycle delayed clock signal ("clk_ref"), indicating that the delay of the delay circuit 210 is shorter than one cycle. This causes the phase detector 140 to output a one indicating the delay of the delay circuit 210 is shorter than one cycle. The delay control circuit 250 sweeps the coarse delay control ("coarse <K:0>") until the output of the phase detector 240 toggles from one to zero at time t1. The sweeping of the coarse delay signal ("coarse <K:0>") may include increasing the coarse delay of the delay circuit 210 by one coarse delay step for each group of m pulses (e.g., four pulses) of the clock signal, as shown in the example in FIG. 9.

After the output 146 of the phase detector 140 toggles from one to zero, the delay control circuit 250 may then decrease the delay of the delay circuit 210 by one coarse delay step causing the output of the phase detector 140 to toggle back to one at time t2. At this point, the coarse delay signal ("coarse <K:0>") is set to the largest coarse delay setting that is shorter than one cycle.

The delay control circuit 250 then sweeps the fine delay control ("fine <N:0>") until the output of the phase detector 140 toggles from one to zero at time t3. At this point, the DLL 205 may be locked. The sweeping of the fine delay control ("fine <N:0>") may include increasing the fine delay of the delay circuit 210 by one fine delay step for each group of m pulses (e.g., four pulses) of the clock signal. As shown in FIG. 9, sweeping the fine delay control ("fine <N:0>") causes the voltage circuit 260 to adjust the control voltages vbp and vbn, in which the fine delay in increased by decreasing the voltage level of vbn and increasing the voltage level of vbp. In this example, the voltage level of vbn may be set high at the start of the fine delay sweep. Starting the voltage level of vbn high helps keep the voltage level of vbn above the threshold voltages of the transistors 340-1 to 340-5 (which reduces sensitivity to threshold mismatches).

In certain aspects, the DLL 205 may be placed close to the delay circuit 160 for controlling the delay of the delay circuit 160. Placing the DLL 205 close to the delay circuit 160 provides close matching between the transistors in the delay circuit 210 and the transistors in the delay circuit 160. This is because closely located circuits on a chip (i.e., die) are subject to the same or similar process, voltage, temperature (PVT) variation and are therefore similarly affected by PVT variation. The close matching helps ensure that the delay control signal from the DLL 205 (which is generated using the delay circuit 210) provides accurate control of the delay of the delay circuit 160.

It is to be appreciated that the present disclosure is not limited to the examples shown in FIGS. 2 to 9. For example, in some implementations, the one cycle delay circuit 130 may be omitted. In this example, the second input 144 of the phase detector 140 is coupled to the input 208 of the DLL 205 without the one cycle delay circuit 130. Thus, the second input 144 of the phase detector 140 may be coupled to the input 208 of the DLL 205 via the one cycle delay circuit 130 or not. In implementations where the one cycle delay circuit 130 is omitted, the DLL 205 may still be able to lock when the delay of the delay circuit 210 is approximately equal to one cycle of the clock signal since the clock signal is periodic (e.g., rising edges of the clock signal are spaced one cycle apart).

As used herein, a switch that is coupled in series with a transistor is coupled in series with the channel of the transistor, in which the channel is between the source and the drain of the transistor.

It is to be appreciated that a transistor may be physically implemented on a chip (i.e., die) with multiple transistors coupled in parallel and/or series in which the gates of the multiple transistors are coupled together.

It is to be appreciated that the present disclosure is not limited to the exemplary terminology used above to describe aspects of the present disclosure. For example, a delay buffer may also be referred to as a delay stage, a delay element, a delay unit, a delay cell, or another term. A control circuit may also be referred to a controller, control logic, or another term. A delay step may also be referred to as a delay unit, or another term. A phase detector may also be referred to as a phase frequency detector, a phase comparator, or another term. Each of the control voltages Vbp and Vbn may also be referred to as a bias voltage or another term.

The delay control circuit 250 may be be implemented with a general-purpose processor, a digital signal processor (DSP), an application specific integrated circuit (ASIC), a field programmable gate array (FPGA) or other programmable logic device, a finite state machine, discrete hardware components (e.g., logic gates), or any combination thereof designed to perform the functions described herein. A processor may perform the functions described herein by executing software comprising code for performing the functions. The software may be stored on a computer-readable storage medium, such as a RAM, a ROM, an EEPROM, an optical disk, and/or a magnetic disk.

Implementation examples are described in the following numbered clauses:

1. A delay buffer, comprising:
   a delay device having an input, an output, and a first current terminal;
   a first current circuit coupled between a first rail and the first current terminal, wherein the first current circuit comprises:
   first transistors; and
   first switches, wherein each one of the first switches is coupled in series with a respective one of the first transistors between the first rail and the first current terminal.

2. The delay buffer of clause 1, wherein the first transistors are binary weighted.

3. The delay buffer of clause 1 or 2, wherein the delay device comprises an inverter.

4. The delay buffer of any one of clauses 1 to 3, wherein the delay device has a second current terminal, and the delay buffer further comprises:
   a second current circuit coupled between a second rail and the second current terminal, wherein the second rail has a lower potential than the first rail, and the second current circuit comprises:
   second transistors; and
   second switches, wherein each one of the second switches is coupled in series with a respective one of the second transistors between the second rail and the second current terminal.

5. The delay buffer of clause 4, wherein:
   the first transistors comprise p-type transistors; and
   the second transistors comprise n-type transistors.

6. The delay buffer of clause 4 or 5, wherein the delay device comprises:
   a p-type transistor, wherein a source of the p-type transistor is coupled to the first current terminal, a gate of the p-type transistor is coupled to the input of the delay device, and a drain of the p-type transistor is coupled to the output of the delay device; and
   an n-type transistor, wherein a source of the n-type transistor is coupled to the second current terminal, a gate of the n-type transistor is coupled to the input of the delay device, and a drain of the n-type transistor is coupled to the output of the delay device.

7. The delay buffer of any one of clauses 4 to 7, wherein the first transistors are binary weighted and the second transistors are binary weighted.

8. A delay locked loop (DLL), comprising:
   a delay circuit having an input and an output, wherein the input of the delay circuit is coupled to an input of the DLL;
   a phase detector having a first input, a second input, and an output, wherein the first input of the phase detector is coupled to the output of the delay circuit, and the second input of the phase detector is coupled to the input of the DLL;
   a delay control circuit having an input, a first output, and a second output, wherein the input of the delay control circuit is coupled to the output of the phase detector, and the first output of the delay control circuit is coupled to the delay circuit; and
   a voltage circuit having an input and an output, wherein the input of the voltage circuit is coupled to the second output of the delay control circuit, and the output of the voltage circuit is coupled to the delay circuit.

9. The DLL of clause 8, further comprising a one cycle delay circuit coupled between the input of the DLL and the second input of the phase detector.

10. The DLL of clause 8 or 9, wherein the delay control circuit is configured to:
    generate a coarse delay control signal based on an output signal of the phase detector;
    output the coarse delay control signal to the delay circuit via the first output;
    generate a fine delay control signal based on the output signal of the phase detector; and
    output the fine delay control signal to the voltage circuit via the second output.

11. The DLL of clause 10, wherein the voltage circuit is configured to:
    convert the fine delay control signal into one or more control voltages; and
    output the one or more control voltages to the delay circuit via the output of the voltage circuit.

12. The DLL of clause 11, wherein the delay circuit is configured to:
    set a coarse delay of the delay circuit based on the coarse delay control signal, wherein the coarse delay control signal comprises a digital code; and
    set a fine delay of the delay circuit based on the one or more control voltages, wherein the fine delay is shorter than the coarse delay.

13. The DLL of clause 12, wherein the coarse delay control signal adjusts the coarse delay of the delay circuit in coarse delay steps and the fine delay of the delay circuit is shorter one of the coarse delay steps.

14. The DLL of any one of clauses 11 to 13, wherein the delay circuit comprises:
    one or more delay buffers, each of the one or more delay buffers comprising:
    a delay device having an input, an output, and a first current terminal;
    a first current circuit coupled between a first rail and the first current terminal, wherein the first current circuit comprises:
    first transistors, wherein gates of the first transistors are biased by a first one of the one or more control voltages; and
    first switches, wherein each one of the first switches is coupled in series with a respective one of the first transistors between the first rail and the first current terminal, and on/off states of one or more of the first switches are controlled by the coarse delay control signal.

15. The DLL of clause 14, wherein the first transistors are binary weighted.

16. The DLL of clause 14 or 15, wherein each of the one or more delay buffers further comprises:
    a second current circuit coupled between a second rail and a second current terminal of the delay device, wherein the second rail has a lower potential than the first rail, and the second current circuit comprises:
    second transistors, wherein gates of the second transistors are biased by a second one of the one or more control voltages; and
    second switches, wherein each one of the second switches is coupled in series with a respective one of the second transistors between the second rail and the second current terminal, and on/off states of one or more of the second switches are controlled by the coarse delay control signal.

17. The DLL of clause 16, wherein:
the first transistors comprise p-type transistors; and
the second transistors comprise n-type transistors.

18. The DLL of clause 16 or 17, wherein the delay device comprises an inverter.

19. A method for locking a delay locked loop (DLL), the DLL including a phase detector, and a delay circuit coupled to an input of the phase detector, wherein a delay of the delay circuit includes a coarse delay controlled by a coarse delay control signal and a fine delay controlled by a fine delay control signal, the method comprising:
sweeping the coarse delay control signal until an output of the phase detector toggles from a first logic value to a second logic value;
after the output of the phase detector toggles from the first logic value to the second logic value, decreasing the coarse delay control signal by a coarse delay, wherein the decrease in the coarse delay control signal causes the output of the phase detector to toggle from the second logic value to the first logic value; and
after the output of the phase detector toggles from the second logic value to the first logic value, sweeping the fine delay control signal until the output of the phase detector toggles from the first logic value to the second logic value.

20. The method of clause 19, further comprising:
delaying a clock signal using the delay circuit;
outputting the first logic value at the output when the delay of the delay circuit is shorter than a cycle of the clock signal; and
outputting the second logic value at the output when the delay of the delay of the delay circuit is longer than the cycle of the clock signal.

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect electrical coupling between two structures. It is also to be appreciated that the term "ground" may refer to a DC ground or an AC ground, and thus the term "ground" covers both possibilities.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A system, comprising:
a delay buffer, comprising:
a delay device having an input, an output, and a first current terminal;
a first current circuit coupled between a first rail and the first current terminal, wherein the first current circuit comprises:
first transistors; and
first switches, wherein each one of the first switches is coupled in series with a respective one of the first transistors between the first rail and the first current terminal; and
a voltage circuit coupled to gates of the first transistors, wherein the voltage circuit is configured to output a first control voltage to the gates of the first transistors, receive a digital code, and set a voltage level of the first control voltage based on the digital code.

2. The system of claim 1, wherein the first transistors are binary weighted.

3. The system of claim 1, wherein the delay device comprises an inverter.

4. The system of claim 1, wherein the delay device has a second current terminal, and the delay buffer further comprises:
a second current circuit coupled between a second rail and the second current terminal, wherein the second rail has a lower potential than the first rail, and the second current circuit comprises:
second transistors; and
second switches, wherein each one of the second switches is coupled in series with a respective one of the second transistors between the second rail and the second current terminal.

5. The system of claim 4, wherein:
the first transistors comprise p-type transistors; and
the second transistors comprise n-type transistors.

6. The system of claim 4, wherein the delay device comprises:
a p-type transistor, wherein a source of the p-type transistor is coupled to the first current terminal, a gate of the p-type transistor is coupled to the input of the delay device, and a drain of the p-type transistor is coupled to the output of the delay device; and
an n-type transistor, wherein a source of the n-type transistor is coupled to the second current terminal, a gate of the n-type transistor is coupled to the input of the delay device, and a drain of the n-type transistor is coupled to the output of the delay device.

7. The system of claim 4, wherein the first transistors are binary weighted and the second transistors are binary weighted.

8. The system of claim 4, wherein the voltage circuit is coupled to gates of the second transistors, and wherein the voltage circuit is configured to output a second control voltage to the gates of the second transistors, and set a voltage level of the second control voltage based on the digital code.

9. The system of claim 1, wherein the voltage circuit comprises:
a current source;
a first bias transistor, wherein a drain of the first bias transistor is coupled to the current source and a gate of the first bias transistor;
a variable transistor, wherein a gate of the variable transistor is coupled to the gate of the first bias transistor, and the variable transistor has a variable channel width controlled by the digital code; and a second bias transistor, wherein a drain of the second bias transistor is coupled to a drain of the variable transistor and a gate of the second bias transistor, and the gate of the second bias transistor is coupled to the gates of the first transistors.

10. The system of claim 9, wherein the variable transistor comprises:
   second transistors, wherein gates of the second transistor are coupled to the gate of the first bias transistor; and
   second switches, wherein each one of the second switches is coupled in series with a respective one of the second transistors, and an on/off state of each one of the second switches is controlled by a respective one of multiple bits of the digital code.

11. The system of claim 1, wherein the first bias transistor comprises an n-type transistor and the second bias transistor comprises a p-type transistor.

12. A system, comprising:
   a delay buffer configured to receive a first digital code, the delay buffer comprising:
      a delay device having an input, an output, and a first current terminal;
      a first current circuit coupled between a first rail and the first current terminal, wherein the first current circuit comprises:
         first transistors; and
         first switches, wherein each one of the first switches is coupled in series with a respective one of the first transistors between the first rail and the first current terminal, and wherein the first digital code controls on/off states of the first switches; and
      a voltage circuit coupled to gates of the first transistors, wherein the voltage circuit is configured to output a first control voltage to the gates of the first transistors, receive a second digital code, and set a voltage level of the first control voltage based on the second digital code.

13. The system of claim 12, wherein the voltage circuit comprises:
   a current source;
   a first bias transistor, wherein a drain of the first bias transistor is coupled to the current source and a gate of the first bias transistor;
   a variable transistor, wherein a gate of the variable transistor is coupled to the gate of the first bias transistor, and the variable transistor has a variable channel width controlled by the second digital code; and
   a second bias transistor, wherein a drain of the second bias transistor is coupled to a drain of the variable transistor and a gate of the second bias transistor, and the gate of the second bias transistor is coupled to the gates of the first transistors.

14. The system of claim 13, wherein the variable transistor comprises:
   second transistors, wherein gates of the second transistor are coupled to the gate of the first bias transistor; and
   second switches, wherein each one of the second switches is coupled in series with a respective one of the second transistors, and an on/off state of each one of the second switches is controlled by a respective one of multiple bits of the second digital code.

15. The system of claim 12, wherein the first bias transistor comprises an n-type transistor and the second bias transistor comprises a p-type transistor.

16. The system of claim 12, wherein the on/off state of each one of the first switches is controlled by a respective one of multiple bits of the first digital code.

17. The system of claim 12, wherein the delay device comprises an inverter.

18. The system of claim 12, wherein the delay device has a second current terminal, and the delay buffer further comprises:
   a second current circuit coupled between a second rail and the second current terminal, wherein the second rail has a lower potential than the first rail, and the second current circuit comprises:
      second transistors; and
      second switches, wherein each one of the second switches is coupled in series with a respective one of the second transistors between the second rail and the second current terminal, and the first digital code controls on/off states of the second switches.

19. The system of claim 18, wherein the voltage circuit is coupled to gates of the second transistors, and wherein the voltage circuit is configured to output a second control voltage to the gates of the second transistors, and set a voltage level of the second control voltage based on the second digital code.

* * * * *